United States Patent [19]
Sirinyan et al.

[11] Patent Number: 4,636,441
[45] Date of Patent: Jan. 13, 1987

[54] SEMI-FINISHED PRODUCTS FOR THE MANUFACTURE OF PRINTED CIRCUIT BOARDS

[75] Inventors: Kirkor Sirinyan, Bergisch Gladbach; Gerhard D. Wolf, Dormagen; Ulrich von Gizycki; Rudolf Merten, both of Leverkusen, all of Fed. Rep. of Germany

[73] Assignee: Bayer Aktiengesellschaft, Leverkusen, Fed. Rep. of Germany

[21] Appl. No.: 785,175

[22] Filed: Oct. 7, 1985

[30] Foreign Application Priority Data

Oct. 9, 1984 [DE] Fed. Rep. of Germany ....... 3436971

[51] Int. Cl.$^4$ ............................................. B32B 9/04
[52] U.S. Cl. .................................... 428/447; 428/450; 428/463; 427/304
[58] Field of Search ...................... 428/447, 450, 463; 427/304

[56] References Cited

U.S. PATENT DOCUMENTS

| | | |
|---|---|---|
| 3,560,257 | 2/1971 | Schneble, Jr. et al. ............. 428/463 |
| 4,248,632 | 2/1981 | Ehrich et al. ...................... 106/1.11 |
| 4,367,072 | 1/1983 | Vogtle et al. ...................... 436/501 |
| 4,395,527 | 7/1983 | Berger ................................. 528/26 |
| 4,480,009 | 10/1984 | Berger ............................... 428/447 |
| 4,499,149 | 2/1985 | Berger ............................... 428/447 |

Primary Examiner—John E. Kittle
Assistant Examiner—Patrick J. Ryan
Attorney, Agent, or Firm—Sprung Horn Kramer & Woods

[57] ABSTRACT

For the electroless metallization of base carriers for the manufacture of printed circuit boards, those carrier materials are outstandingly suitable on which complex compounds are built up in which the ligands and the ions to be complexed have entered a "host-guest interrelationship". Examples of such activator compounds are complexes of crown ethers, cryptands and the like. The resulting printed circuit boards are distinguished by the high adhesive strengths of the metals deposited on them.

9 Claims, No Drawings

SEMI-FINISHED PRODUCTS FOR THE MANUFACTURE OF PRINTED CIRCUIT BOARDS

The invention relates to semi-finished products for the manufacture of printed circuit boards.

It is generally known that the precipitation of strongly adhering metal deposits on the customary insulating base materials requires expensive pretreatment. Thus, for example, the base plates for the manufacture of printed circuit boards from glass mat-reinforced epoxide resins or paper-reinforced phenolic resins must first be provided with an adhesion-promoter layer and then be treated with an oxidizing fluid, preferably chromic and sulphuric acids, before the plates thus prepared can be activated with ionic or colloidal noble metal solutions, masked and metallised in commercially available metallising baths.

Apart from the multi-stage nature of these methods, this technique has the disadvantage that entrained chromium ions irreversibly poison the baths and that the printed circuit boards obtained show unsatisfactory electrical properties.

It has therefore already been proposed to activate the non-conductive surfaces of substrates, for example base carriers of printed circuit boards, without an oxidative pretreatment with a solution or a coating of a noble metal/amine complex compound or of palladium chloride for the subsequent chemical metallisation (compare, for example, Nos. DE-A 1,696,603 and DE-A 2,116,389, corresponding to U.S. Pat. Nos. 3,560,257 and 4,248,632 respectively).

However, these activation methods, which inherently do not attack the material, have hitherto been unable to gain acceptance in practice, since they require relatively large quantities of noble metal and do not acheive the high peel strengths of the metal deposits, required in the electronics industry. For this reason, an additional surface treatment with etching agents is recommended at least in the firstmentioned patent publication (compare column 6, line 48).

It has now been found that these disadvantages can be avoided and semi-finished products for the manufacture of printed circuit boards can be obtained in a simple manner, that is to say without etching and without an adhesion-promoter layer, when the base plates are treated with an activator system which contains a metal complex compound in which the (selective) ligands and the ions or molecules to be complexed are in a so-called "host-guest interrelationship".

If desired, an electrically conductive metal deposit can be applied in a layer thickness of 0.1–10 μm to the plates thus activated by a wet chemical-electroless method or a combined wet chemical-electroless/electroplating method.

The base plates activated in this way and then metallized, if appropriate, that is to say the so-called semi-finished products, can be processed in the customary manner by the fully additive or semi-additive technique to give printed circuit boards (mounting plates).

Compared with the known subtractive method, in which metal deposits of up to 70 μm thickness must be partially dissolved out by means of etching solutions, the process according to the invention has the advantage, when carrying out the semi-additive technique, that metal layers of a maximum thickness of only 10 μm, preferably 0.1 to 7.5 μm or, particularly preferably, 0.1 to 5.0 or 0.1 to 2.0 μm respectively, have to be etched out, and this entails a considerable saving in material.

In comparison with the manufacture of printed circuit boards by likewise known "thin-layer methods", which are characterized by the lamination of thin-layer deposits prepared by electroplating or by the chemical deposition of metals by means of a rubber-containing adhesion-promoting deposit, the novel process is distinguished by a smaller amount of work and by improved mechanical, thermal and electrical properties of the polymeric base material.

The selective complex ligands which can be used are cyclic or acyclic compounds which, due to their chemical and/or physical nature, are a host molecule or, in the presence of ionic or neutral compounds to be complexed, assume the shape required for the formation of a complex or adduct, the polar regions being aligned towards the medium to be complexed in the presence of the latter.

As is known, the selectivity of the host molecule for the guest ion or molecule to be complexed depends on the ring size, steric structure or chemical nature (whether polar or hydrophobic) of the latter. In the literature, numerous selective host molecules which can form a selective guest/host complex with the alkali metal or alkaline earth metal cations such as $Li^+$, $Na^+$, $K^+$, $Ca^{2+}$ or $NH_4^+$ (compare E. Weber, "Kontakte" (Darmstadt) 1, (1984) and J. G. Schindler, "Bioelektrochemische Membranelektroden (Bio-electrochemical Membrane Electrodes)" pages 77–104, Walter de Gruyter Verlag, Berlin/New York (1983)) or with heavy metal ions such as $Co^{2+}$, $Ni^{2+}$, $Fe^{3+}$, $Cd^{2+}$ and $Ag^+$ and with anions such as $Cl^-$ and $SO_4^{2-}$ (compare the paper by J. G. Schindler, quoted above, pages 104–112) and with the neutral ligands or compounds, have been described.

For carrying out the novel process according to the invention, all host complex ligands are suitable which contain hetero-atoms (O, N and S) in their chain. Crown ethers, cryptands and podands or their derivatives as well as cyclic peptides are very suitable, as are ester-linked macrolides containing tetrahydrofuran and analogous compounds based on hetero-atoms such as S and N, which are known as transport regulators, for example in biological systems.

A definition of the terms "crown ethers", "cryptands" and "podands" is to be found in the review papers by F. Vögtle, "Kontakte" (Darmstadt) (1977) and (1978), E. Weber, "Kontakte" (Darmstadt) (1984) and Vögtle "Chemikerzeitung" 97, 600–610 (1973).

For carrying out the process according to the invention, substituted or unsubstituted host ligands based on cyclic or acyclic crown ethers which, in their ring system, also can additionally contain hetero-atoms such as N and S, are used with particular preference. Such compounds are described in Nos. DE-A 2,842,862 or EP-A 10,615 and correspond, for example, to the formula

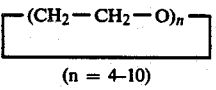

$$\overline{\phantom{x}(CH_2-CH_2-O)_n\phantom{x}} \quad (I)$$

(n = 4–10)

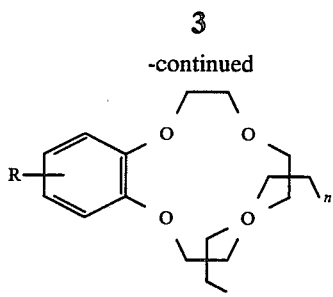

n=0-4
R=alkyl, aryl, halogen and others

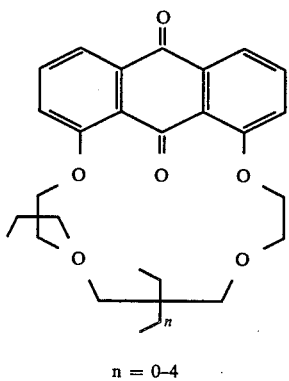

n = 0-4

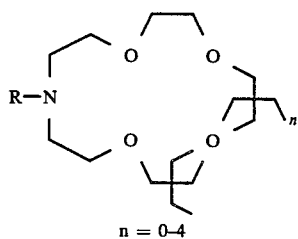

n = 0-4

R=alkyl or aryl; for example, methyl, ethyl, phenyl, biphenyl, phenylazophenyl and others.

The cyclic compounds indicated above are preferred.

Another variant of carrying out the process according to the invention comprises incorporating the host molecules mentioned covalently into polymeric or oligomeric compounds and then complexing them with the desired activation media. Such oligomeric or polymeric systems are known and are described, for example, in "Novel Polyurethanes with Macroheterocyclic (Crown-Ether) Structures in the Polymer Backbone", J. E. Herweh, J. of Polymer Science: Polymer Chemistry Edition, Vol. 21, 3101 (1983).

The inorganic part of the host/guest molecules is preferably formed (1) from compounds of the formula $$Me^{n+} E^{m+} Hal_z^{-}$$

in which

Me represents hydrogen, alkali metal or alkaline earth metal atoms or heavy metal atoms (Fe, Co, Ni or Cu) or $NH_4$, Hal represents halogen (preferably Cl and Br) and E represents a noble metal atom from the first or eighth sub-group of the periodic table (preferably Pt, Pd and Au) having the valency m and the coordination number z, with z−m=n, or (2) from the cations of the said elements, preferably $Ag^+$, $Cu^{2+}$ and $Cu^+$ or preferably (3) from non-complex salts of these elements of the formula $$E^{m+} Hal_p^{-} (p=m)$$

or (4) from customary colloidal systems of these noble metals.

The noble metal compounds to be used preferably are those of the formula $H_2PdCl_4$, $Na_2(PdCl_2Br_2)$, $Na_2PdCl_4$, $CaPdCl_4$, $Na_4(PtCl_6)$, $Ag\ NO_3$ $HAuCl_4$, $CuCl_2$ and $CuCl$. The Pd compounds are preferred.

Suitable colloidal noble metal systems are derived above all from the metals Pd, Pt, Au and Ag and are described, for example, in "Kunststoffgalvanisierung (Electroplating of Plastics)" by R. Weiner, Eugen G. Leuze Verlag, Saulgau/Württ. (1973), pages 180–209.

In the case indicated under item (1), the electrically neutral ligand at the phase boundary receives the cation $Mn^+$ in its endohydrophilic cavity and transports it into the organic solvent phase, the part $E^{m+}$ $Hal_z^-$ also being transported into the desired solvent phase by means of the resulting potential gradient. This phenomenon is also relevant in principle to the systems listed under items (2), (3) and (4).

The activation solution can be prepared by dissolving the host molecule in a suitable aprotic solvent having boiling points around 80° C., such as perchloroethylene, 1,1,1-trichloroethane, $CH_2Cl_2$, petroleum ether or chloroform, and addition of the noble metal system in accordance with the principle already mentioned.

Another possibility for preparing the activation systems to be used according to the invention is to introduce the said noble metals in an aqueous phase and to let them diffuse or complex, again in accordance with the principle mentioned, into an organic phase containing the host molecules capable of complex formation, to separate the organic phase from the aqueous phase, to wash it until neutral if necessary, to free it from the solvent by recrystallisation or evaporation and then to employ it for the activation in a desired liquid medium.

Although such systems have an unlimited storage life in protic and aprotic solvents under conditions customary in the technique of the electroplating of plastics, they show, surprisingly, good activation properties for the electroless chemical metallisation.

The activators can be employed in concentration ranges from 0.001 g/liter (relative to the noble metal) up to the particular solubility limit. Preferably, 0.1 to 3.0 g/liter of these substances are used.

Due to their long storage life (no turbidity in the solutions - sometimes even after storage for several weeks) and their strong sorption in the ultraviolet and/or visible spectral region, they are outstandingly suitable for continuous concentration monitoring by a photometer.

Moreover, the sorption properties of the complex compounds to be used according to the invention can be further enhanced by the introduction of special substituents (in particular $NO_2$, $-^+NR_3$, $-SO_3^H$ and $-CN$).

The influence of electron-attracting and electron-repelling substituents on the light absorption properties of carbon molecules is known and can be found, for example, in D. H. Williams and J. Flemming "Spektroskopische Methoden in der organischen Chemie (Spectroscopic Methods in Organic Chemistry)", Georg Thieme Verlag Stuttgart (1971).

To increase the peel strength of the activator or metal deposit, the said host molecules can be additionally provided with a further functional group.

In certain cases, very good adhesive strength on the substrate surface is achieved by means of the further functional group, and this adhesive strength can be based on a chemical reaction with the substrate surface or on an adsorption or absorption.

Functional groups, such as carboxylic acid groups, carboxylic acid halide groups, carboxylic acid anhydride groups, carboxylic acid ester groups, carbonamide and carbonimide groups, aldehyde and keto groups, ether groups, sulphonamide groups, sulphonic acid groups and sulphonate groups, sulphonic acid halide groups, sulphonic acid ester groups, halogen-containing heterocyclic radicals, such as chloro-triazinyl, -pyrazinyl, -pyrimidinyl or -quinoxalinyl groups, activated double bonds, such as in vinylsulphonic acid or acrylic acid derivatives, amino groups, hydroxyl groups, isocyanate groups, olefin groups and acetylene groups as well as mercapto groups and epoxide groups, and also longer-chain alkyl or alkenyl radicals of $C_8$ and above, in particular oleyl, linoleyl, stearyl or palmityl groups, are particularly suitable for chemically anchoring the activator to the substrate surface.

If there is no anchorage by a chemical reaction, the adhesive strength can also be effected by adsorbtion of the organometallic activators on the substrate surface, possible causes of the adsorbtion being, for example, hydrogen bonds or Van der Waals forces.

It is advantageous to match the functional groups causing the adsorption to the particular substrate. Thus, for example, long-chain alkyl or alkenyl groups in the activator molecule improve the adhesive strength on substrates of polyethylene or polypropylene. For the metallisation of articles based on polyamide or polyester, by contrast, activators with, for example, additional carbonyl or sulpho groups are particularly advantageous.

Functional groups such as carboxylic acid groups and carboxylic acid anhydride groups are particularly suitable for anchoring the activator to the substrate surface by adsorption.

When the novel process is carried out in practice, the procedure is in general such that the base carriers to be metallised are wetted with a solution of the selective metal complex in a suitable organic solvent, the solvent is removed and, if desired, the carriers are sensitised with a suitable reducing agent. Subsequently, the carrier thus pretreated can be metallized in a customary metallizing bath.

In addition to the abovementioned solvents, perchloroethylene, 1,1,1-trichloroethane, $CH_2Cl_2$, n-hexane, petroleum ether, cyclohexanone, alcohols such as n-butanol, tert.-butanol and isopropanol, ketones such as methyl ethyl ketone, aldehydes such as n-butanal-1 as well as DMF and DMSO are suitable.

If the organometallic compound contains ligands which allow chemical fixing on the substrate surface, activation from an aqueous phase can also be possible.

Suitable reducing agents for the sensitisation are aminoboranes, alkali metal hypophosphites, alkali metal borohydrides, hydrazine hydrate and formalin. The substrates can be wetted by spraying, printing, soaking or impregnating.

In order to enhance the adhesion of the metal deposit to the carrier surface, those solvents or solvent mixtures which cause a slight incipient solution or incipient swelling of the plastic surface to be metallised are employed particularly preferably for carrying out the process according to the invention.

Aprotic solvents, such as 1,1,1-trichloroethane, methylene chloride, trichloromethane, perchloroethylene and toluene are very particularly suitable for carrying out the process. Activation systems according to the invention, which additionally also contain hydrolysable metal organic compounds of titanium, aluminium, zirconium, silicon or tantalum in quantities of 0.1–20, preferably 0.1–3 and particularly preferably 0.1–2 g/liter, are preferably employed. Tetramethylsilicate, octamethylcyclotetrasiloxane, hexamethylcyclotrisiloxane and Ti, Al or Zr acetylacetonate may be mentioned in this context.

The solvents are removed from the wetted carriers simply by evaporation or, in the case of higher-boiling compounds, by extraction.

According to a preferred process variant, the activation baths are monitored by means of a photometer as a detector. In this case, the wavelength of the filter should correspond to the approximate absorption maximum of the solution. The measured signal is recorded by a compensation recorder, and is called up in cycles from 0.1 second up to several minutes by a timing generator. In this way, the missing components (solvent, activator) can be metered in by means of a computer.

A very particularly preferred embodiment of the process according to the invention comprises carrying out the reduction in the metallising bath simultaneously with the reducing agent of the electroless metallisation. This embodiment represents a simplification of electroless metallisation which was hitherto not feasible.

This embodiment is very particularly suitable for the nickel baths which contain aminoborane and are to be employed preferably or for formalin-containing copper baths.

The metallising baths which can be employed in the process according to the invention are commercially available baths of nickel salts, cobalt salts, copper salts, gold salts and silver salts, or mixtures thereof.

For reinforcement by electrodeposition, the following metals can be used: Ni, Co, Cu, Ag, Al, Cr and Au. Cu is preferred.

The semi-finished products, that is to say the base plates provided by the process according to the invention with a virtually monomolecular noble metal-crown ether layer and made from plastics reinforced with, for example, glass fibre, aramide fibre or carbon paper mats or hard paper, have hitherto not been described in the literature and are therefore likewise a subject of the invention.

Preferred plastics for the preparation of the base plates are ourable materials, such as, for example, phenolic resins, epoxide resins, melamine resins and polyester resins.

The semi-finished materials for the manufacture of printed circuit boards have, surprisingly, the following advantageous properties:

1. In the activated state in air, they are stable towards moisture and the effects of weather and heat.
2. Their activator deposit is not removable from the surface during the application or development of photoresist deposits.
3. No poisoning of the metallisation or sensitisation baths occurs during the sensitisation or metallisation.

EXAMPLE 1

A glass mat-reinforced epoxide resin board (200×200×1 mm) is provided with standard perforations and then provided in the course of three minutes with a crown ether/Pd layer in a Pd-containing activation bath based on 1,4,7,10,13-pentaoxacyclododecane at RT (room temperature).

The preparation of the abovementioned activation bath can be carried out as follows:

1 liter of $CH_2Cl_2$ (technical) which additionally also contains 2.5 g of 1,4,7,10,13-pentaoxacyclododecane and 2 g of tetrabutyl titanate is added at RT to 1.7 g of aqueous HCl-free $Na_2PdCl_4$ solution (15% by weight Pd content) and stirred for a further 10 minutes, before the aqueous phase is separated off from the organic phase.

The semi-finished product thus prepared is provided with a partial mask (screen printing process), sensitised in the course of five minutes in an aqueous sensitising bath consisting of 15 g/liter of dimethylaminoborane and 5 g/liter of solid KOH, washed and then partially copper-plated in a commercially available metallizing bath.

This gives a printed circuit board produced by the fully additive process and having good adhesive strength of the metal.

EXAMPLE 2

1 liter of 1,1,1-trichloroethane which additionally also contains 3.5 g of the polymeric crown ether compound of the formula

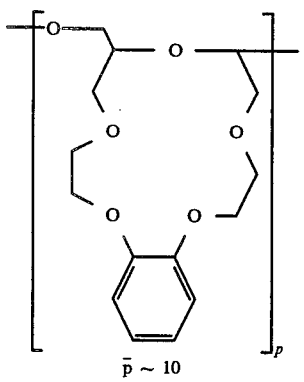

(see, for example, Makromol. Chem., Rapid Commun. 5. 115–118 (1984)) is added at 45° C. to 15 g of methanolic $K_2PtCl_6$ solution (Pt content about 1.75% by weight), and the mixture is then stirred for a further 30 minutes. The aqueous phase is then separated off from the organic phase, and 1.3 g of tetraisopropyl orthotitanate are added to the organic phase.

This gives a dark-coloured homogeneous activation solution. Glass mat-reinforced epoxide resin boards (200×200×2 mm) are treated for 5 minutes with this solution. The board thus activated, that is to say provided with a virtually monomolecular organometallic Pt/crown ether deposit, is sensitised for 7.5 minutes in a sensitising bath, which contains 20 ml of $NH_2$–$NH_2$ and 12 ml of $NH_3$ (25% strength) per liter, and then metallized for 30 minutes at 30° C. in a commercially available nickel-plating bath. This gives a semi-finished product which, after partial masking with a commercially available photoresist and after reinforcement of the free tracks by electrodeposition and subsequent removal of the photoresist from the board surface or from the Ni deposit located below the latter, can be processed to give a printed circuit board.

The peel strength of the partial metal deposit (conductor tracks) is good. Electrical investigations show that the good electrical properties of the base material are not affected by the treatments described.

EXAMPLE 3

1 liter of $CH_2Cl_2$ (technical) which additionally also contains 3.5 g of crown ether of the formula

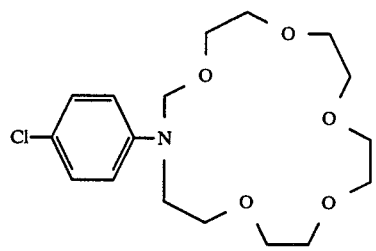

is added at 35° C. to 15 g of aqueous $HAuCl_4$ solution (Au content 1.8% by weight), and the mixture is stirred for a further 40 minutes. The aqueous phase is then separated off from the organic phase, and 12 ml of tetramethylsilicate are added to the organic phase.

A hard paper-reinforced phenolic resin board (200×200×1.5 mm) is treated for five minutes at RT.

The semi-finished board provided in this way with Au/crown ether/Si can be processed without any problems either by the semi-additive process or by the fully additive process to give printed circuit boards (FR-2 quality).

EXAMPLE 4

A commercially available glass mat-reinforced epoxide resin board (200×40×1 mm) (FR-4 quality) is treated for five minutes in a solution consisting of 0.01 mol of 1,4,7,10,13,16-hexaoxacyclooctadecane/-$Na_2PdCl_4$ complex compound, 2.5 g of tetrabutyl titanate and 1000 ml of $CCl_2$=$CCl_2$.

This gives a semi-finished board with a virtually monomolecular Pd/crown ether layer.

The board thus prepared is provided in a commercially available Cu bath at 70° C. with an ~1.0 μm thick Cu deposit, covered by a commercially available UV-curable screen printing lacquer using a mask which has free comb-shaped continuous tracks of about 500 μm and then reinforced to 40 μm by electrodeposited nickel.

EXAMPLE 5

An aramide fibre-reinforced epoxide resin board (150×150×2 mm) is provided in the course of five minutes at RT in a solution consisting of 1 liter of $CCl_3$—$CH_3$ and 0.01 mol of 1,4,7,10,13,16-hexaoxacyclooctadecane/lithium tetrachloropalladate with a Pd/crown ether layer. This gives a semi-finished product which can be metallised by chemical means and which is outstanding suitable for the manufacture of printed circuit boards with a good FR-4 property pattern either by the semi-additive technique or the fully additive technique.

EXAMPLE 6

A glass fibre-reinforced, commercially available unsaturated polyester resin board is activated in the course of 60 seconds in a solution consisting of 2.3 g of 1,4,7,10,13,16-hexaoxacyclooctadecane-hexachloroplatinic acid and 2 g of aluminium acetylacetonate in 1 liter of $CH_2Cl_2$.

This gives a platinised semi-finished product which can readily be metallised in accordance with Example 1 and is suitable for the manufacture of electric printed circuit boards. Preparation of 1,4,7,10,13,16-hexaoxacyclooctadecanehexachloroplatinic acid:

12 ml of n-propanol which additionally also contains 5.284 g of 1,4,7,10,13,16-hexaoxacyclooctadecane are added to 6.5 g of $H_2PtCl_6$ solution (with a Pt content of 0.01 mol), the mixture is stirred for 4 hours at 35° C., the solution is filtered off while warm, concentrated in vacuum to 50 ml and then left to stand overnight in a refrigerator, and the precipitate thus synthesised is filtered off, washed with cold, repurified n-propanol and dried in vacuum.

This gives a crystalline canary-yellow Pt/crown ether compound having a decomposition point at 158° C.

We claim:

1. A semi-finished product for the manufacture of printed circuit boards, consisting essentially of a base carrier and a metal complex compound applied thereto and having an activating effect on electroless metallisation, wherein in said complex compound, the ligand and the ion or molecule to be complexed show a mutual "host/guest interaction".

2. A semi-finished product according to claim 1, wherein the host molecule, capable of forming complexes, in the metal complex compound is a crown ether, cryptand or podand.

3. A semi-finished product according to claim 1, wherein the complex ligand or the host molecule is a cyclic compound which, in the presence of the medium to be complexed, assumes the structure required for complex formation of host/guest interaction, respectively.

4. A semi-finished product according to claim 1, wherein the host molecule is a cyclic crown ethers of the formula

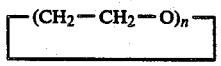

wherein n=4–10,

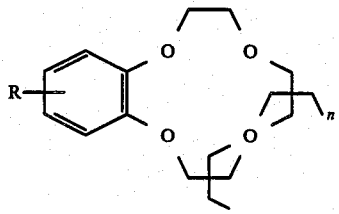

wherein
n=0–4

R=alkyl, aryl, halogen and others,

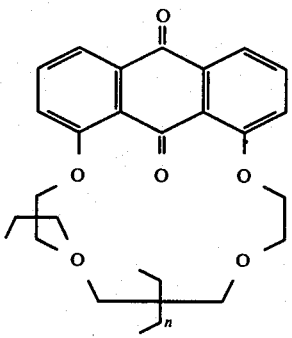

wherein
n=0–4 or

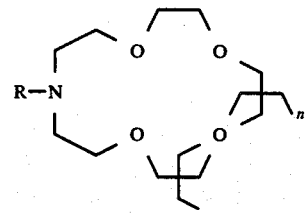

wherein
n=0–4
R=alkyl or aryl, for example methyl, ethyl, phenyl, biphenyl, phenylazophenyl and others.

5. A semi-finished product according to claim 1, wherein the selective complex ligand or the host molecule in the metal complex compound has a pure hydrocarbon skeleton which is interrupted by O-atoms.

6. A semi-finished product according to claim 1, wherein the inorganic part of the host/guest molecule is formed from a compound of the formula

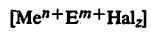

wherein Me represents hydrogen, alaki metal, alkaline earth metal or heavy metal atoms or $NH_4$, Hal represents halogen, E represents a noble metal atom from the first and eighth sub-group of the periodic table, having the valency m and the coordination number z, with z−m=n.

7. A semi-finished product according to claim 1, wherein the guest molecule to be complexed is a compound selected from $H_2PdCl_4$, $Na_2(PdCl_2Br_2)$, $Na_2PdCl_4$, $CaPdCl_4$, $Na_4(PtCl_6)$, $AgNO_3$, CuCl and $CuCl_2$.

8. A semi-finished product according to claim 1, wherein the base carrier consists of optionally fibre-reinforced phenolic, melamine, epoxide or polyester resins.

9. In a process for the preparation of a semi-finished product for the manufacture of printed circuit boards by treating a base carrier with activator system, based on metal complex compounds, for electroless metallisation, the improvement comprising the use of a metal complex compound, the ligands and the ions or molecules to be complexed show a mutual "host/guest interrelationship".

* * * * *